United States Patent
Banerjee et al.

(10) Patent No.: US 9,070,705 B2
(45) Date of Patent: Jun. 30, 2015

(54) HEMT SEMICONDUCTOR DEVICE AND A PROCESS OF FORMING THE SAME

(71) Applicant: Semiconductor Components Industries, LLC, Phoenix, AZ (US)

(72) Inventors: Abhishek Banerjee, Mechelen (BE); Peter Moens, Zottegem (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/190,839

(22) Filed: Feb. 26, 2014

(65) Prior Publication Data

US 2014/0264367 A1    Sep. 18, 2014

Related U.S. Application Data

(60) Provisional application No. 61/798,215, filed on Mar. 15, 2013.

(51) Int. Cl.
| | |
|---|---|
| *H01L 29/15* | (2006.01) |
| *H01L 29/66* | (2006.01) |
| *H01L 29/423* | (2006.01) |
| *H01L 29/778* | (2006.01) |
| *H01L 29/20* | (2006.01) |

(52) U.S. Cl.
CPC ...... *H01L 29/66431* (2013.01); *H01L 29/4236* (2013.01); *H01L 29/66462* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 2009/0148985 | A1 | 6/2009 | Heying et al. |
| 2011/0049526 | A1 | 3/2011 | Chu et al. |
| 2012/0034768 | A1 | 2/2012 | Sato |
| 2013/0001646 | A1* | 1/2013 | Corrion et al. ............. 257/194 |

OTHER PUBLICATIONS

M. Van Hove, "CMOS Process-Compatible High-Power Low-Leakage AlGaN/GaN MISHEMT on Silicon", IEEE Electron Device Letters, vol. 33, pp. 667-669, 2012.
K. Donghyun, "Recessed 70-nm Gate-Length AlGaN/GaN HEMTs Fabricated Using an Al2O3/SiNx Dielectric Layer ", IEEE Electron Device Letters, vol. 30, pp. 913-915, 2009.
Hocine Ziad et al., U.S. Appl. No. 14/202,773, filed Mar. 10, 2014.

* cited by examiner

*Primary Examiner* — Marvin Payen
(74) *Attorney, Agent, or Firm* — Abel Law Group, LLP

(57) ABSTRACT

A HEMT semiconductor device can include a dielectric layer that includes a silicon nitride film and an AlN film. In an embodiment, the HEMT semiconductor device can include a GaN film and an AlGaN film. In a process of forming the HEMT device, the AlN can provide an etch stop when forming an opening for a gate electrode.

20 Claims, 4 Drawing Sheets

HEMT SEMICONDUCTOR DEVICE AND A PROCESS OF FORMING THE SAME

CROSS-REFERENCE TO RELATED APPLICATION

This application claims priority under 35 U.S.C. §119(e) to U.S. Patent Application No. 61/798,215 entitled "Method of Forming HEMT Semiconductor Devices and Structure Therefor," by Banerjee et al., filed Mar. 15, 2013, which is assigned to the current assignee hereof and incorporated herein by reference in its entirety.

FIELD OF THE DISCLOSURE

The present disclosure relates to semiconductor devices and processes of forming semiconductor devices.

RELATED ART

High electron mobility transistor (HEMT) devices can include gallium nitride as one of the semiconductor materials to achieve the high electron mobility. One problem with these prior structures and devices was that the materials used for insulators or dielectrics generally did not have a high enough dielectric constant or often resulted in forming stresses in the resulting devices. A need exists for a HEMT semiconductor device that includes high dielectric constant insulator or dielectric materials and more robust when stressed.

BRIEF DESCRIPTION OF THE DRAWINGS

Embodiments are illustrated by way of example and are not limited in the accompanying figures.

Figure 1:
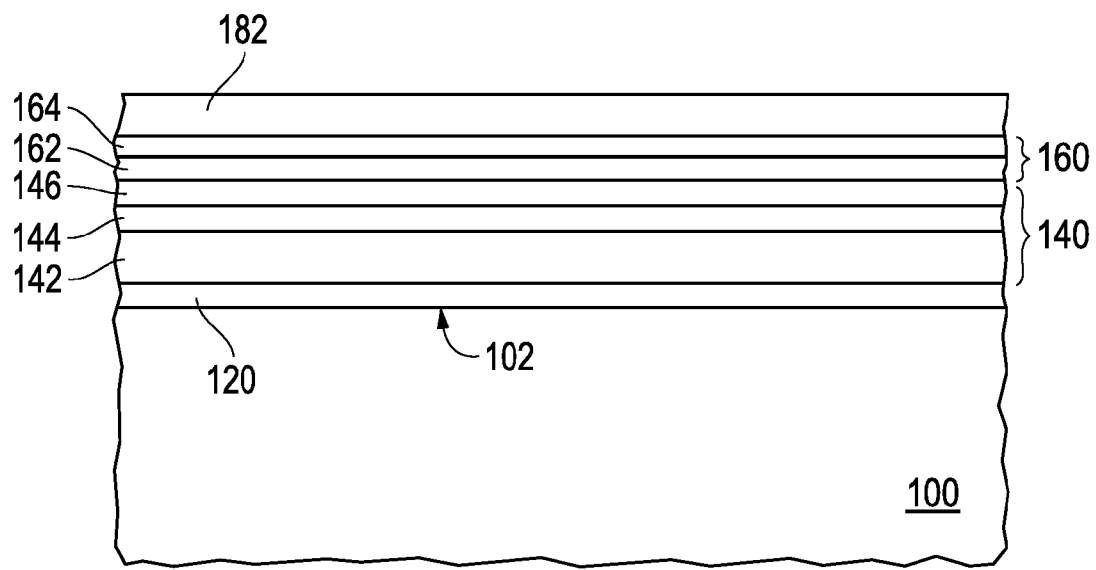
FIG. 1 includes an illustration of a cross-sectional view of a portion of a workpiece including a substrate, a nucleation layer, a semiconductor layer, a gate dielectric layer, and a capping layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers corresponding to columns within the Periodic Table of Elements based on the IUPAC Periodic Table of Elements, version dated Jan. 21, 2011.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

For simplicity and clarity of the illustrations, elements in the figures are not necessarily to scale, and the same reference numbers in different figures denote the same elements, unless stated otherwise. Additionally, descriptions and details of well-known steps and elements are omitted for simplicity of the description. As used herein current, carrying electrode means an element of a device that carries current through the device, such as a source or a drain of an MOS transistor or an emitter or a collector of a bipolar transistor or a cathode or anode of a diode, and a control electrode means an element of the device that controls current through the device, such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the concepts described herein. One of ordinary skill in the art understands that the conductivity type refers to the mechanism through which conduction occurs such as through conduction of holes or electrons, therefore, and that conductivity type does not refer to the doping concentration but the doping type, such as P-type or N-type.

The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or in the Detailed Description, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A HEMT semiconductor device can include a substrate having a primary surface, a GaN film overlying the primary surface of the substrate, and a dielectric layer overlying the GaN film, wherein the dielectric layer includes a first silicon nitride film overlying the GaN film, and an AlN film on the first silicon nitride film. In an embodiment, a capping layer can be formed over the dielectric layer and include a silicon nitride film. When patterning the capping layer, the AlN film can provide an etch stop to allow an opening for a gate electrode to be reproducibly formed. As compared to a substantially HEMT semiconductor device without the AlN film, the HEMT semiconductor device with the AlN film has a lower gate capacitance than a gate dielectric layer that only includes silicon nitride. The lower gate capacitance allows for lower input capacitance and provides a faster switching speed for the HEMT device. Further, the HEMT device with AlN film has a more stable threshold voltage and drain current. Still further, the HEMT device with the AlN film has significantly less degradation in terms of threshold voltage shift and current collapse during DC off-state stress measurements, as compared to the comparable device. More details regarding the structure and its formation are described below.

FIG. 1 includes an illustration of a cross-sectional view of a portion of a workpiece that includes a substrate 100, a nucleation layer 120, a semiconductor layer 140, a gate dielectric layer 160, and a capping layer 182. The substrate 100 has a primary surface 102 and can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface 102 can be selected depending upon the composition of the semiconductor layer 140 that will be subsequently formed over the substrate 100. The nucleation layer 120 can help to epitaxially grow the semiconductor layer 140. In an embodiment, the nucleation layer 120 may include one or more elements that are common to the subsequently formed semiconductor layer 140. In a particular embodiment, the nucleation layer can include aluminum nitride when an aluminum-containing semiconductor layer 140 is being formed over the nucleation layer 120. The thickness of the nucleating layer can be in a range of 20 nm to 1000 nm.

The semiconductor layer 140 can include a buffer film 142, a channel film 144, and a barrier film 146. The composition of the buffer film 142 may depend on the composition of the channel film 144. In an embodiment, the channel film 144 includes GaN, and the buffer film 142 includes AlGaN. The composition of the buffer film 142 can be changed as a function of thickness, such that the buffer film 142 has a relatively greater aluminum content closer to the nucleation layer 120 and relatively greater gallium content closer to the channel film 144. In a particular embodiment, the cation (metal atoms) content in the buffer film 142 near the nucleation layer 120 can be 10% to 100% Al with the remainder Ga, and the cation content in the buffer film 142 near the channel film 144 can be 0% to 50% Al with the remainder Ga. The buffer film 142 can have a thickness in a range of approximately 1 micron to 5 microns. The channel film 144 can include GaN and have a thickness in a range of approximately 20 nm to 4000 nm. The barrier film 146 can be used to help reduce the likelihood of migration of contaminants or other materials between one or more films underlying the barrier film 146 and gate dielectric layer 160. In a particular embodiment, the buffer film 146 can include AlGaN, wherein the cation content is 10% to 100% aluminum with the remainder gallium. The barrier film 146 can have a thickness in a range of approximately 2 to 30 nm. The semiconductor layer 140 is formed using an epitaxial growth technique. In a particular embodiment, metal-containing films can be formed using metalorganic chemical vapor deposition. In another embodiment, different composition for the semiconductor layer 140 may be used, e.g., InAlGaN, InP, or the like.

The gate dielectric layer 160 can include a wide bandgap, high dielectric constant ("high k") material that is lattice matched to silicon nitride. The high k value can provide a high electrical field across the gate dielectric layer 160 and allow for a higher gate overdrive. The high k material has is believed to be similar to or as good quality as an $Al_2O_3$ formed by atomic layer deposition. Such high k material also has a high etch selectivity to silicon nitride, so it can additionally function as an etch stop when etching an overlying layer that includes silicon nitride. Thus, the high k material assists in increasing etch reproducibility and repeatability to improve the manufacturability of the device and also improving the performance of transistor being formed. In the embodiment as illustrated in FIG. 1, the gate dielectric layer 160 can include a silicon nitride film 162 and an AlN film 164. The silicon nitride film 162 can have a thickness and a range of approximately 5 nm to 40 nm, and the AlN nitride film 164 can have a thickness in a range of approximately 2 nm to 20 nm. In another embodiment, the gate dielectric layer 160 can include fewer or more films that may have the same or different compositions as described. The gate dielectric layer 160 has nitride-nitride bonding between silicon nitride and AlN films 162 and 164 that facilitates reducing formation of interface states at the silicon nitride/AlN interface that can improve dispersion/current collapse related phenomena. An optional $Al_2O_3$ film (not illustrated) can be formed by oxidizing a portion of the AlN film 164 in an oxidizing ambient, such as $O_2$, $N_2O$, or the like).

The capping layer 182 can be used to protect the gate dielectric layer 160. The capping layer 182 can include silicon nitride and have a thickness in a range of approximately 20 nm to 500 nm. The gate dielectric layer 160 and the capping layer 182 can be formed using a chemical or physical vapor technique.

In an embodiment, the nucleating layer 120, the semiconductor layer 140, the gate dielectric layer 160, and the capping layer 182 are formed without exposing the workpiece to air or another oxygen-containing gas. Thus, the layers and films can be formed without an oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or film. In still another embodiment, an oxide film may be formed and remain. For example, after forming the gate dielectric layer 160, the workpiece may be exposed to air before forming the capping layer 182.

Figure 2:
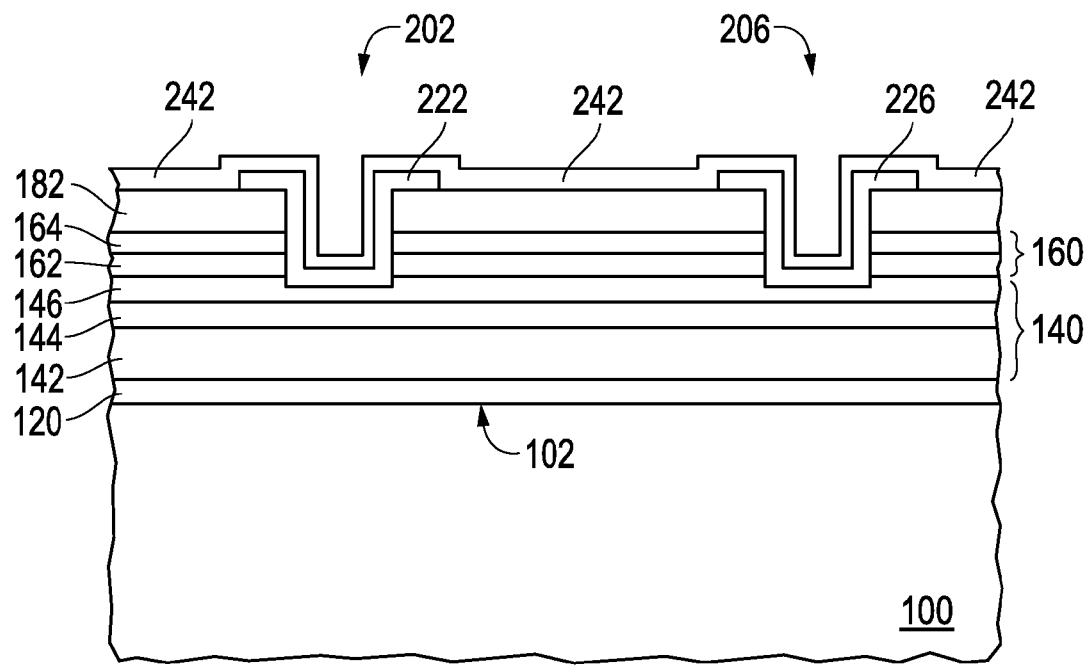
FIG. 2 includes an illustration of a cross-sectional view of the workpiece of FIG. 1 after forming source and drain contacts and a sealing layer.

FIG. 2 includes an illustration of a cross-sectional view of the workpiece of FIG. 1 after patterning layers to form contact openings 202 and 206 and forming source and drain contacts 222 and 226. A resist layer (not illustrated) is formed over the workpiece and the gate dielectric layer 160 and the capping layer 182 are patterned to define a source contact opening 202 and a drain contact opening 206. The etching of layers 146 and 164 can be performed using reactive ion etching with a chlorine-containing gas, such as $Cl_2$, $BCl_3$, HCl, or the like. The etching of layers 182 and 162 can be performed using reactive ion etching with a fluorine-containing gas, such as $SF_6$, $CHF_3$, $CF_4$, or the like. The etching can be performed as a timed etch, using endpoint detection, or a combination of endpoint detection along with a timed overetch. The etch stops on or within the barrier film 146. A source contact 222 and a drain contact 226 are formed within the source and drain contact openings 202 and 206. The source and drain contacts 222 and 226 can be formed by depositing a conductive layer within the contact openings and patterning the conductive layer. The conductive layer can include Ti, TiN, Al, Pd, Pt, W, Au, Ni, or a stack or any combination thereof. The conductive layer may partly or completely fill the contact openings.

A sealing layer 242 is formed over workpiece including the source and drain contacts 222 and 226. The sealing layer 242 helps to keep water or other contaminants from migrating along the interface between the contacts 222 and 226 and the capping layer 182. The sealing layer 242 can include an insulating nitride, such as silicon nitride, and has a thickness in a range of 20 to 200 nm.

A resist layer (not illustrated) is formed over the workpiece and is patterned to define openings over the contacts 222 and 226 and over a location where a gate electrode will be formed. Exposed portions of the sealing layer 242 and capping layer 182 are etched to expose the contacts 222 and 226 and to define a gate electrode opening 304. The silicon nitride of the sealing layer 242 and capping layer 182 can be etched selective to the contacts 222 and 226, which include a metal-containing material, and selective to the AlN film 164. In an embodiment, the etch can be performed using reactive ion etching using a fluorine-containing gas, such as $CF_4$, $CHF_3$, $SF_6$, or the like. The etch may be performed using a timed etch, endpoint detection, or a combination of endpoint detection and a timed overetch. In another embodiment, the AlN layer 164 can be removed from within in the gate opening 304.

Figure 3:
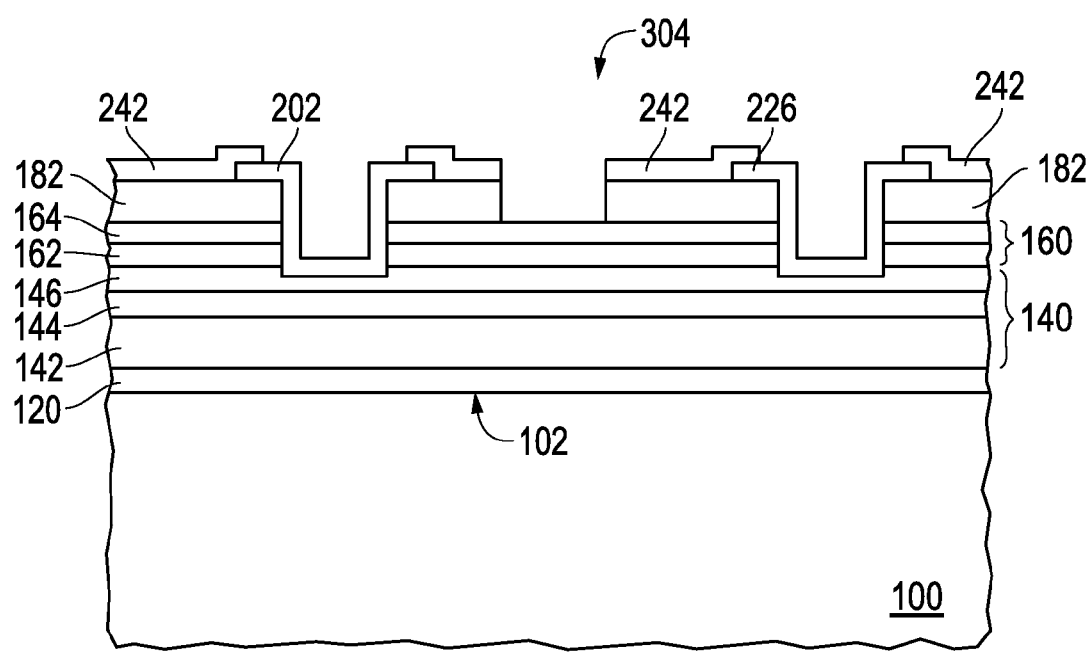
FIG. 3 includes an illustration of a cross-sectional view of the workpiece of FIG. 2 after patterning the sealing and capping layer for form openings to the source and drain contacts and an opening for a gate electrode.
Figure 4:
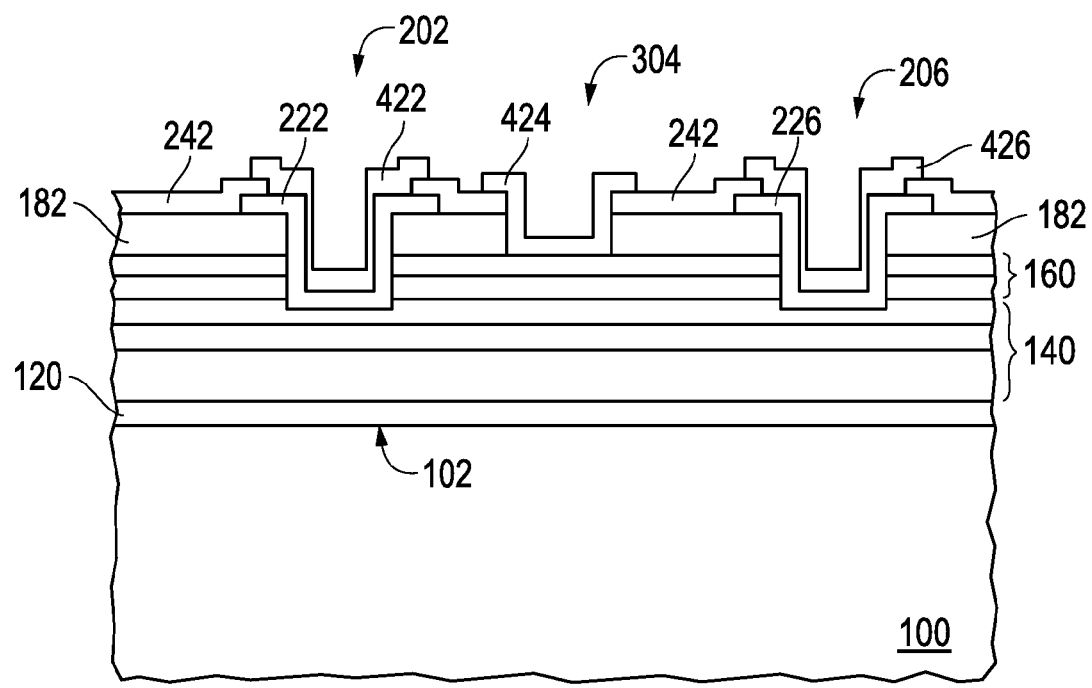
FIG. 4 includes an illustration of a cross-sectional view of the workpiece of FIG. 3 after forming the gate electrode.

FIG. 4 includes an illustration of a cross-sectional view of a portion of the workpiece of FIG. 3 after forming interconnects 422 and 426 and a gate electrode 424. A conductive layer is deposited over the workpiece and within the contact openings 222 and 226 and within the gate electrode opening 324. The conductive layer has a composition selected to provide a proper work function for the transistor being formed. The conductive layer can include Ti, TiN, Al, Pd, Pt, W, Au, Ni, or a stack or any combination thereof and has a thickness in a range of 50 nm to 500 nm. The conductive layer is patterned to form the interconnect 422 within the source contact opening 222, the interconnect 426 within the drain contact openings 226, and the gate electrode 424 within the gate electrode opening.

Figure 5:
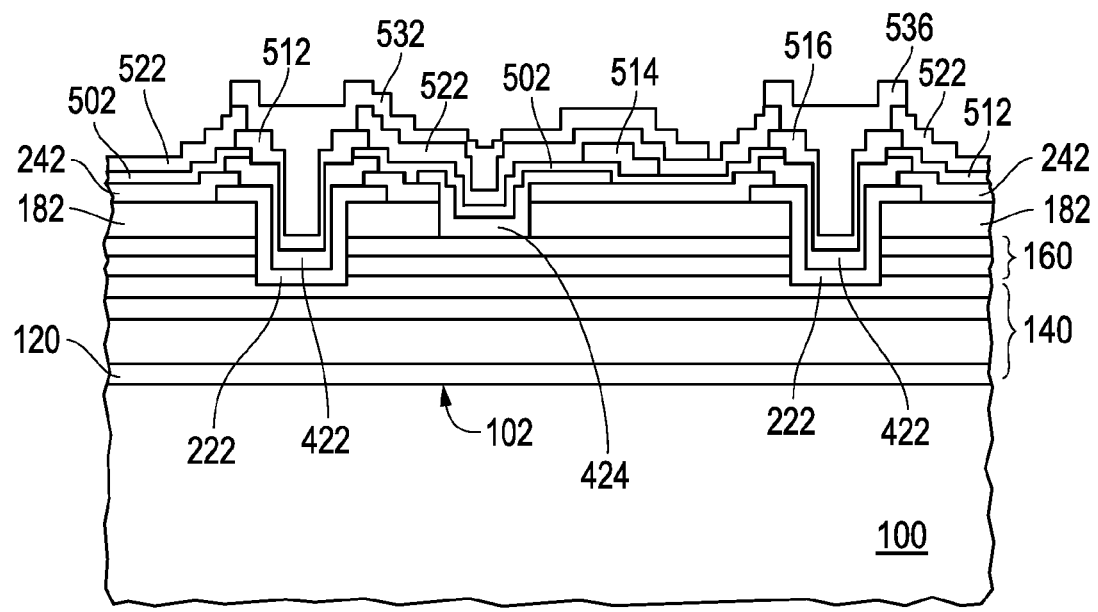
FIG. 5 includes an illustration of a cross-sectional view of the workpiece of FIG. 4 after forming a substantially completed device.

Processing is continued to form a substantially completed device as illustrated in FIG. 5. An insulating layer 502 is formed over the workpiece and patterned to form via openings to interconnects, including interconnects 422 and 426. Although not illustrated, a via opening may also be made to the gate electrode 424. A second level of interconnects, including interconnects 512, 514, and 516, are formed. Another insulating layer 522 is formed over the workpiece and patterned to form via openings to interconnects, including interconnects 512 and 516. Although not illustrated via openings may be made to the gate electrode 424, the interconnect 514, another suitable structure, or any combination thereof. A third level of interconnects, including interconnects 532 and 536, are formed. One or more additional insulating layers and levels of interconnects can be formed if needed or desired. Each of the insulating layers can include one or more films of oxide, nitride, or oxynitride and have a thickness in a range of 0.2 microns to 4 microns. Each of the interconnects can include one or more films of conductive material. The interconnects are typically at least 50 wt % aluminum, copper, a noble metal, or an alloy of any of the foregoing. A passivation layer (not illustrated) may be formed over the uppermost level of interconnects.

Embodiments as described herein provide many benefits in terms of electrical performance and manufacturability. Manufacturability is discussed above with respect to the formation of the HEMT device. Regarding electrical performance, the gate dielectric layer 160 has a lower gate capacitance than a gate dielectric layer that only includes silicon nitride. The lower gate capacitance allows for lower input capacitance and provides a faster switching speed for the HEMT device. The HEMT device with the gate dielectric layer 160 has nearly no hysteresis, whereas a similar device with a gate dielectric layer that only includes silicon nitride has significant hysteresis. Thus, the HEMT device with the gate dielectric layer 160 has a more stable threshold voltage and drain current. Further, the HEMT device with the gate dielectric layer 160 has significantly less degradation in terms of threshold voltage shift and current collapse during DC off-state stress measurements, as compared to a similar device with a gate dielectric layer that only includes silicon nitride. Leakage current through the gate dielectric for HEMT devices with the gate dielectric layer 160 and the gate dielectric layer that only includes silicon nitride are comparable to one another. More details regarding electrical performance are discussed below in the Examples section.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. A HEMT semiconductor device can include:
a substrate having a primary surface;
a GaN film overlying the primary surface of the substrate; and
a dielectric layer overlying the GaN film, wherein the dielectric layer includes a first silicon nitride film overlying the GaN film, and an AlN film on the first silicon nitride film.

Item 2. A method of forming a HEMT semiconductor device can include:
  providing a substrate having a primary surface;
  forming a GaN film overlying the primary surface of the substrate; and
  forming a gate dielectric layer overlying the GaN film including forming a first silicon nitride film and forming an AlN film on the first silicon nitride film.

Item 3. The method of Item 2, further including forming a second silicon nitride film on the AlN film.

Item 4. The method of Item 3, wherein forming the dielectric layer includes forming a nitride-to-nitride bond between the first silicon nitride layer and the AlN layer and forming another nitride-to-nitride bond between the AlN layer and the second silicon nitride layer.

Item 5. The method of Item 3 or 4, further including:
  etching an opening extending through the second silicon nitride layer; and
  forming a gate electrode within the opening extending through the second silicon nitride layer and in direct contact with the AlN layer.

Item 6. The method of Item 3 or 4, further including:
  etching an opening extending through the second silicon nitride layer and the AlN film; and
  forming a gate electrode within the opening extending through the second silicon nitride layer and in direct contact with the first silicon nitride layer.

Item 7. The method of any one of Items 2 to 6, further including forming an AlGaN film on the GaN film, and forming the gate dielectric layer on the AlGaN film.

Item 8. The HEMT semiconductor device or the method of any one of the preceding Items, wherein the HEMT semiconductor includes a heterojunction that includes the GaN film.

Item 9. The HEMT semiconductor device or the method of any one of Items 1 to 5 and 8, the heterojunction further includes a first AlGaN film overlying the GaN film, wherein the dielectric layer overlies the first of AlGaN film.

Item 10. The HEMT semiconductor device or the method of Item 9, further including a source contact and a drain contact to the first AlGaN film.

Item 11. The HEMT semiconductor device or the method of any one of Items 1 to 4 and 7 to 10, further including a gate electrode that directly contacts the AlN film.

Item 12. The HEMT semiconductor device or the method of any one of Items 1 to 4 and 7 to 10, further including a gate electrode that directly contacts the first silicon nitride film.

Item 13. The HEMT semiconductor device of any one of Items 9 to 12, further including a second AlGaN film, wherein the second AlGaN film is disposed between the substrate and the GaN film.

Item 14. The HEMT semiconductor device or the method of any of the preceding Items, wherein the HEMT semiconductor device exhibits less gate capacitance as compared to another HEMT semiconductor device that is substantially the same except that the dielectric layer only includes the first silicon nitride film and no AlN film.

EXAMPLES

The examples below are provided to demonstrate the improvement in electrical performance when using embodiments as described herein as compared to a similar device that has a gate dielectric layer that only includes a silicon nitride layer. The data as presented herein is merely used for exemplification and not to limit the scope of the appended claims.

Two HEMT devices were formed and were substantially the same except for gate dielectric layers. One HEMT had a gate dielectric layer that consisted essentially of a silicon nitride film in direct contact with a semiconductor layer, and an AlN film in direct contact with the silicon nitride film, wherein the silicon nitride film had a thickness of 10 nm, and the AlN had a thickness of 2 nm. Such device is referred to as the "AlN/SiN Dielectric" device. Another HEMT had a gate dielectric layer that consisted essentially of silicon nitride film in direct contact with a semiconductor layer, and no AlN film, wherein the silicon nitride film had a thickness of 10 nm. Such device is referred to as the "SiN Dielectric" device.

Figure 6:
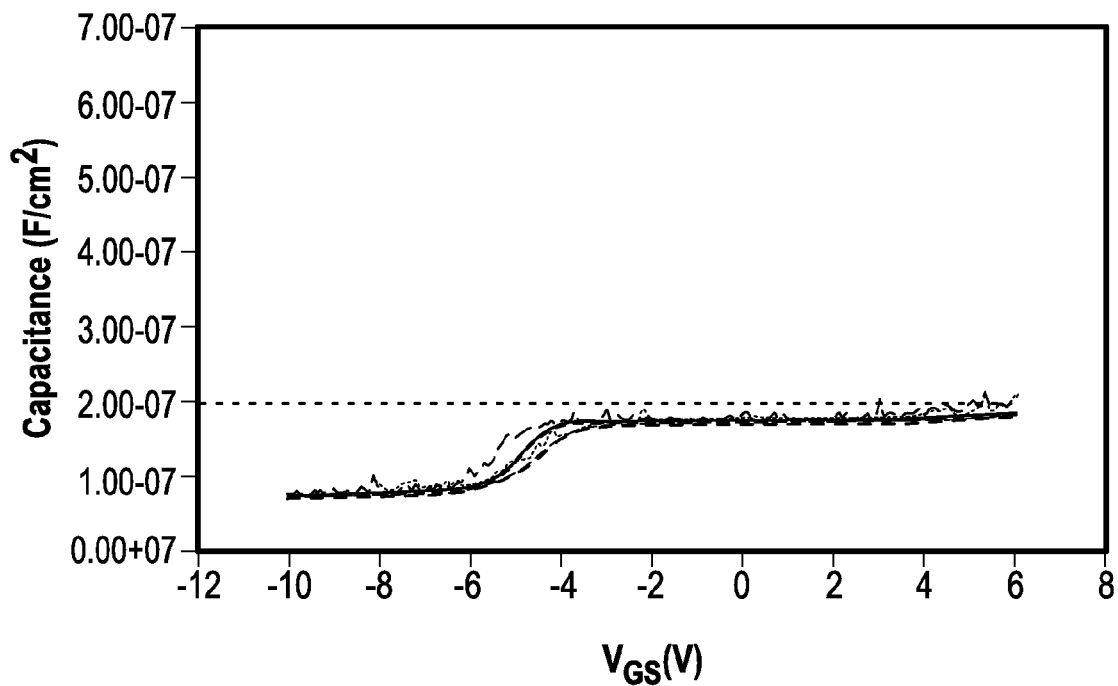
FIGS. 6 and 7 include plots of gate capacitance as a function of gate-to-source voltage for an AlN/SiN Dielectric device and a SiN Dielectric device.
Figure 7:
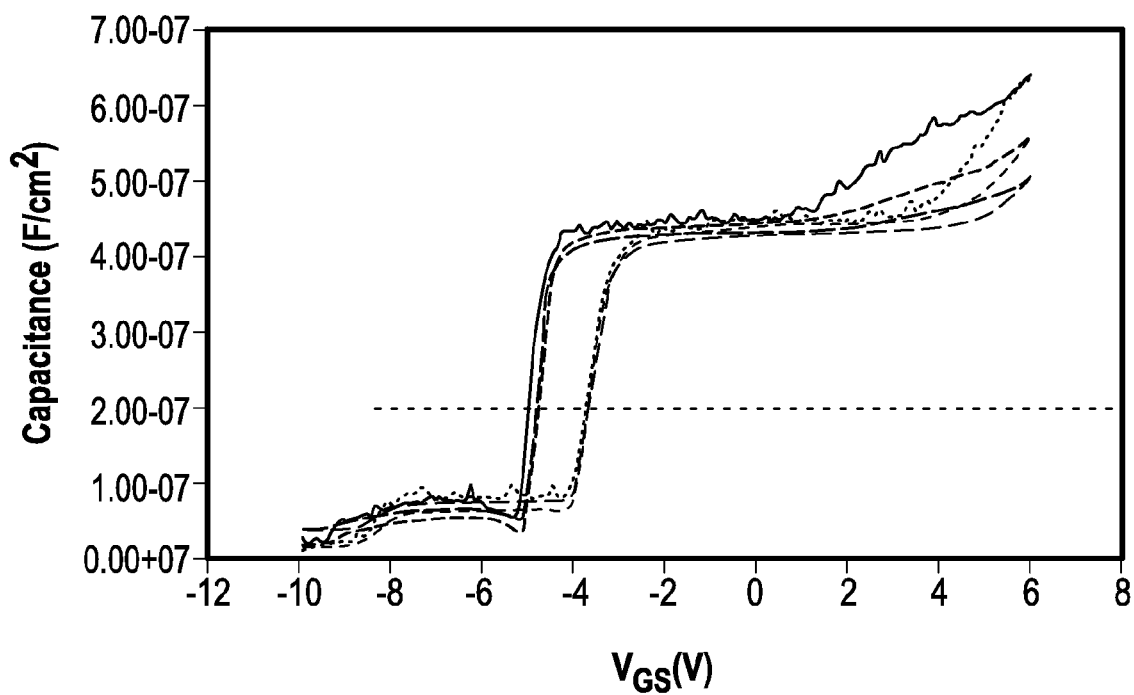
Figure 8:
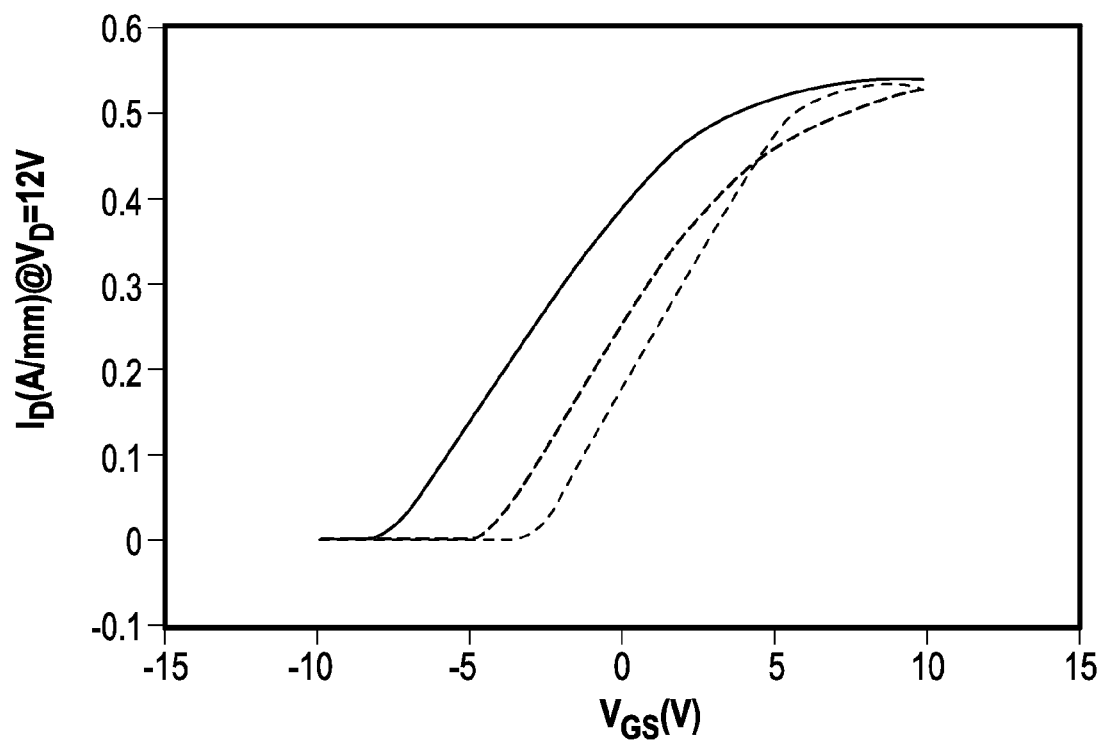
FIG. 8 includes plots of drain current for the AlN/SiN Dielectric device and the SiN Dielectric device when such devices have a gate-to-source voltage swept between −10 V to +10 V.

The devices were tested for gate capacitance. The voltage between the gate and source ($V_{GS}$) was swept from −10 V to +6 V at a constant signal frequency. The tests were repeated for signal frequencies of 1 kHz, 150 kHz, and 1 MHz. FIGS. 6 and 7 include plots of gate capacitance as a function of $V_{GS}$. In FIG. 6, the AlN/SiN Dielectric device has a gate capacitance that is no greater than $2\times10^{-7}$ F/cm$^2$ even at +6 V. In FIG. 7, the SiN Dielectric device has a gate capacitance that is more than double the gate capacitance of the AlN/SiN Dielectric device for $V_{GS}$ from −3 V to +6 V. The gate capacitance is in a range of approximately $4.2\times10^{-7}$ F/cm$^2$ to $6.3\times10^{-7}$ F/cm$^2$ for the SiN Dielectric device. The devices were tested for DC hysteresis when the voltage difference between the drain and source (VD) was 12 V, and VGS was swept from −10V to +10 V. FIG. 8 includes the resulting data. The Al/SiN Dielectric device has no or very little hysteresis. The SiN Dielectric device has hysteresis that appears to have a butterfly shape. Both the threshold voltage and drain current for the AlN/SiN device are expected to be more stable based on the data in FIG. 8.

Accordingly the AlN/SiN Dielectric device has superior electrical performance as compared to the SiN Dielectric device. The AlN/SiN Dielectric device has a lower gate capacitance and allows for faster switching as compared to the SiN Dielectric device. The AlN/SiN Dielectric device has a more stable threshold voltage as compared to the SiN Dielectric device. Thus, the AlN/SiN Dielectric device is more stable and robust as compared to the SiN Dielectric device.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A HEMT semiconductor device comprising:
   a substrate having a primary surface;
   a GaN film overlying the primary surface of the substrate;
   a dielectric layer overlying the GaN film, wherein the dielectric layer includes a first silicon nitride film overlying the GaN film, and an AlN film on the first silicon nitride film; and
   a gate electrode disposed above the dielectric layer such that a line vertically bisecting the gate electrode intersects the first silicon nitride film and the AlN film.

2. The HEMT semiconductor device of claim 1, wherein the HEMT semiconductor comprises a heterojunction that includes the GaN film.

3. The HEMT semiconductor device of claim 2, the heterojunction further comprises a first AlGaN film overlying the GaN film, wherein the dielectric layer overlies the first of AlGaN film.

4. The HEMT semiconductor device of claim 3, further comprising a source contact and a drain contact to the first AlGaN film.

5. The HEMT semiconductor device of claim 1, wherein the gate electrode directly contacts the AlN film.

6. The HEMT semiconductor device of claim 5, wherein the AlN film has a thickness in a range of 2 nm to 20 nm.

7. The HEMT semiconductor device of claim 1, wherein the gate electrode directly contacts the first silicon nitride film.

8. The HEMT semiconductor device of claim 1, further comprising a second AlGaN film, wherein the second AlGaN film is disposed between the substrate and the GaN film.

9. The HEMT semiconductor device of claim 1, wherein the HEMT semiconductor device exhibits less gate capacitance as compared to another HEMT semiconductor device that is substantially the same except that the dielectric layer only includes the first silicon nitride film and no AlN film.

10. The HEMT semiconductor device of claim 1, wherein the HEMT semiconductor device exhibits less threshold voltage shift as compared to another HEMT semiconductor device that is substantially the same except that the dielectric layer only includes the first silicon nitride film and no AlN film.

11. A method of forming a HEMT semiconductor device comprising:
    providing a substrate having a primary surface;
    forming a GaN film overlying the primary surface of the substrate;
    forming a gate dielectric layer overlying the GaN film including forming a first silicon nitride film and forming an AlN film on the first silicon nitride film; and
    etching an opening after forming the gate dielectric layer.

12. The method of claim 11, further comprising forming an AlGaN film overlying the GaN film.

13. The method of claim 11, further including forming a second silicon nitride film on the AlN film.

14. The method of claim 13, wherein forming the dielectric layer includes forming a nitride-to-nitride bond between the first silicon nitride film and the AlN film, and forming another nitride-to-nitride bond between the AlN film and the second silicon nitride film.

15. The method of claim 13, further comprising:
    forming a gate electrode within the opening extending through the second silicon nitride film and in direct contact with the AlN film.

16. The method of claim 11, wherein forming the gate dielectric layer includes forming a nitride-to-nitride bond between the first silicon nitride film and the AlN film.

17. The method of claim 11, wherein forming the gate dielectric layer includes oxidizing at least a portion of the AlN film.

18. The method of claim 11, further including forming the AlGaN film on the GaN film, and forming the gate dielectric layer on the AlGaN film.

19. The method of claim 11, further including forming an opening in the gate dielectric layer including forming the opening to extend through the AlN film by selectively etching the AlN film and stopping the etch on the first silicon nitride film, then etching the exposed portion of the first silicon nitride film to extend the opening through the first silicon nitride film.

20. A HEMT semiconductor device comprising:
    a substrate having a primary surface;
    a channel film overlying the primary surface of the substrate;
    a dielectric layer overlying the channel film, wherein the dielectric layer includes a first silicon nitride film overlying the channel film, and an AlN film on the first silicon nitride film; and
    a gate electrode disposed above and entirely spaced apart from the channel film by the dielectric layer.

* * * * *